United States Patent
Amos et al.

(10) Patent No.: US 6,797,057 B1
(45) Date of Patent: Sep. 28, 2004

(54) COLLOIDAL PHOTONIC CRYSTALS

(75) Inventors: Richard M Amos, QinetiQ Malvern (GB); Paul R Tapster, QinetiQ Malvern (GB); John G Rarity, QinetiQ Malvern (GB); Terence J Shepherd, QinetiQ Malvern (GB); Stephen C Kitson, Bristol (GB)

(73) Assignee: Qinetiq Limited, Farnborough (GB)

( * ) Notice: Subject to any disclaimer, the term of this patent is extended or adjusted under 35 U.S.C. 154(b) by 0 days.

(21) Appl. No.: 10/070,382

(22) PCT Filed: Sep. 5, 2000

(86) PCT No.: PCT/GB00/03405
§ 371 (c)(1),
(2), (4) Date: Aug. 20, 2003

(87) PCT Pub. No.: WO01/18283
PCT Pub. Date: Mar. 15, 2001

(30) Foreign Application Priority Data

Sep. 7, 1999 (GB) .............................. 9921048

(51) Int. Cl.[7] ................................. C30B 7/08
(52) U.S. Cl. .............................. 117/68; 117/69; 117/70
(58) Field of Search ................................. 117/68, 69, 70

(56) References Cited

U.S. PATENT DOCUMENTS

| | | | |
|---|---|---|---|
| 5,139,611 A | | 8/1992 | Pusey et al. |
| 5,541,614 A | * | 7/1996 | Lam et al. ............... 343/792.5 |
| 6,261,469 B1 | * | 7/2001 | Zakhidov et al. ............. 216/56 |
| 6,339,030 B1 | * | 1/2002 | Constant et al. ............ 438/758 |
| 6,392,341 B2 | * | 5/2002 | Jacobsen et al. ............ 313/506 |
| 6,404,127 B2 | * | 6/2002 | Jacobsen et al. ............ 313/506 |
| 6,614,161 B1 | * | 9/2003 | Jacobsen et al. ............ 313/461 |

FOREIGN PATENT DOCUMENTS

EP 0 168 988 A 1/1986

OTHER PUBLICATIONS

Frolov S V et al: "Laser–like emission In opal photonic crystals"Optics,Communications,NL, North–Holland Publishing Co. Amsterdam, vol. 162, No. 4–6, Apr. 15, 1999 (1999–04–in), pp. 241–246, XP004165466 ISSN:0030–4018.

Kim E et al: Two– and Three–Dimensional Crystallization of Polymeric Microspheres by Micromolding in Capillaries, Advanced Materials, VCH Verlagsgesellschaft, Weinheim, DE, vol. 8, No. 3, Mar. 1, 1996, pp. 245–247, XP000558265 ISSN; 0935–9648.

Yoshino K et al.; "The Optical Properties of Porous Opal Crystals Infiltrated with Organic Molecules", Japanese Journal of Applied Physics,JP,Publication Office Japanese Journal of Applied Physics. Tokyo,vol. 36, No. 6A, Part 02, Jun. 1, 1997, pp. L714–L717, XP000727779 ISSN:0021–4922.

* cited by examiner

*Primary Examiner*—Robert Kunemund
(74) *Attorney, Agent, or Firm*—Nixon & Vanderhye P.C.

(57) ABSTRACT

A method of growing robust large area colloidal photonic crystals and devices produced thereby. A suspension of monosized colloidal spheres (1) is subjected to a composite shear (6) by applying a sequential set of shearing forces. The crystalline layers within the colloid experience shearing forces with components in both x and y directions, forcing the colloid into a singe face-centered-cubic structure in preference to a twinned face-centered-cubic structure. The method may also comprise the use of a dispersion medium which is capable of undergoing a controllable phase change from a liquid phase to a solid phase. The crystal may be fixed into a single face-centered cubic structure.

34 Claims, 5 Drawing Sheets

Figure 1:
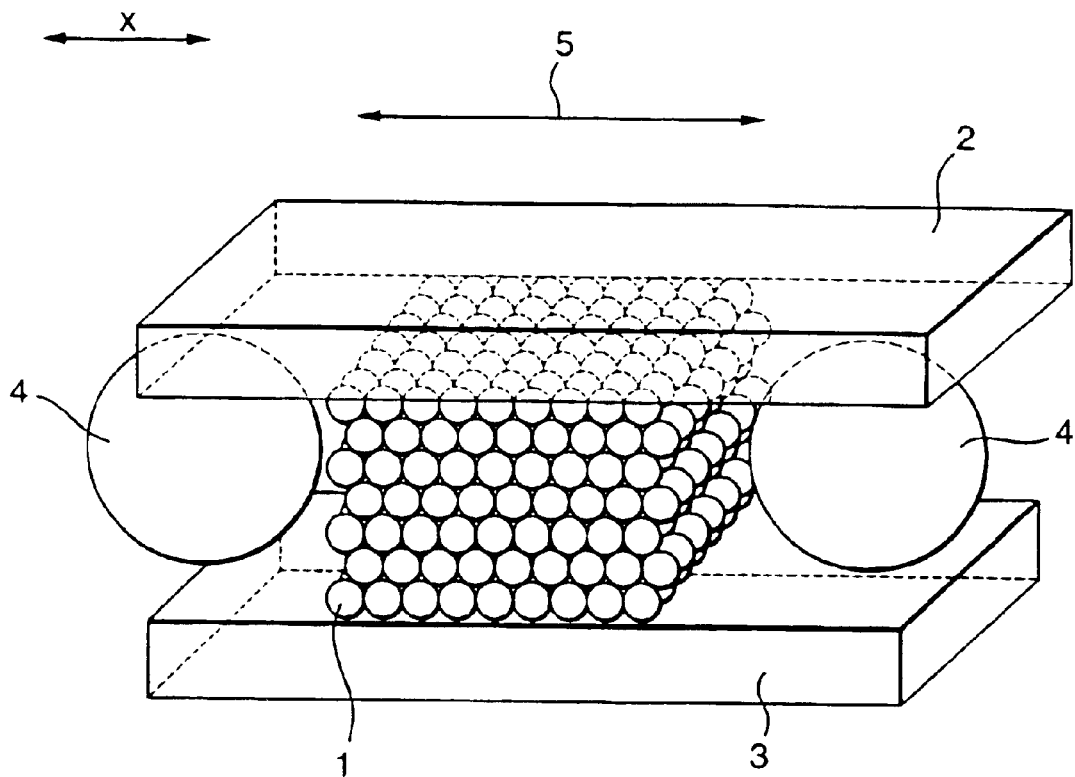

Fig.3a. Fig.3b. Fig.3c.
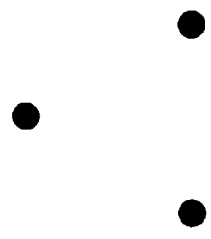 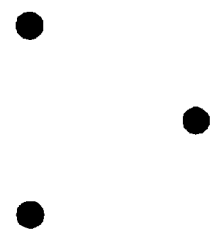 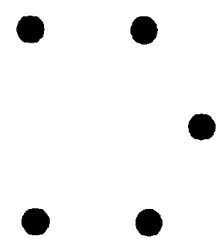
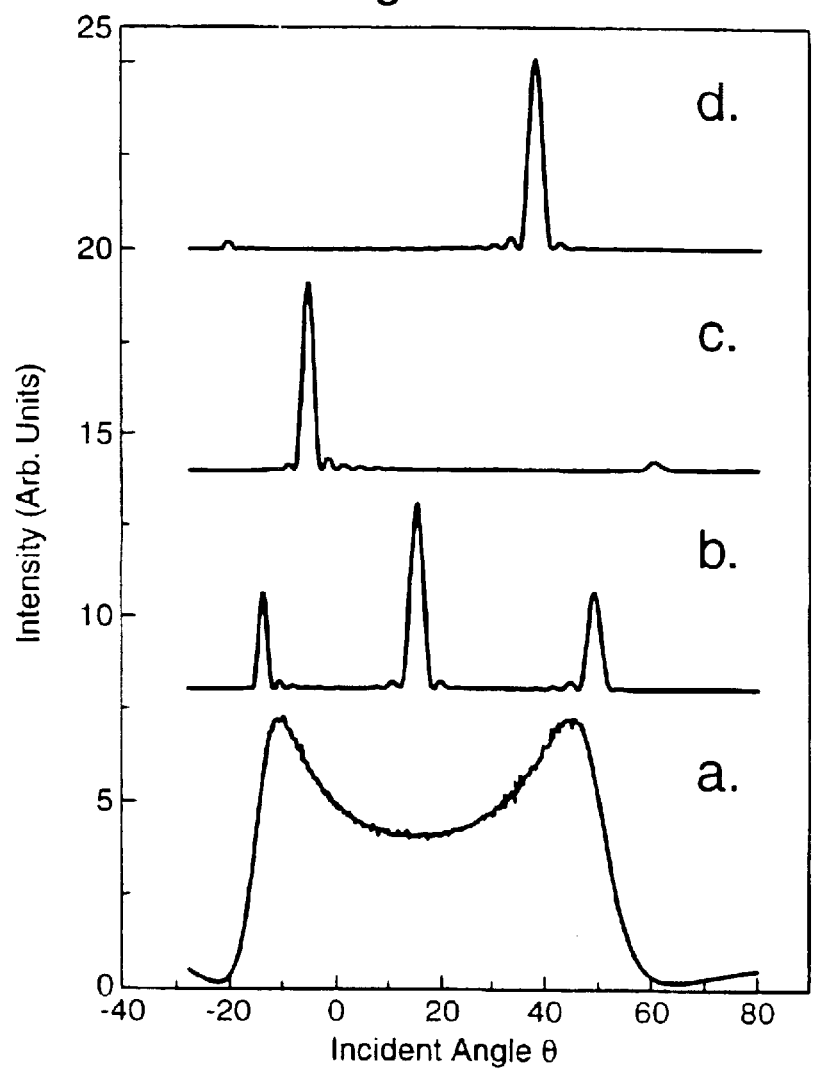
Fig.4.

COLLOIDAL PHOTONIC CRYSTALS

This application is the US national phase of international application PCT/GB00/03405 filed 5 Sep. 2000, which designated the US.

The present invention relate to colloidal photonic crystals, to a method of growing robust large area colloidal crystals and devices produced thereby.

For the purposes of this patent, a photonic crystal shall be defined as an object whose optical properties are spatially periodic.

It has been known for some time that colloidal suspensions can be made to crystallise under certain conditions to produce colloidal crystals which exhibit interesting optical properties.

Such photonic colloidal crystals are capable of modifying the propagation of light due to the fact that the crystal structure is periodic on the scale of the wavelength of light. Accordingly, colloidal photonic crystals find applications in a variety of optical devices including optical filters and limiters. The reflective properties of colloidal photonic crystals can also be controlled offering further opportunities for exploitation in optical devices.

Bulk samples of such crystals are however usually polycrystalline and comprise many hundreds of crystals of the order of 100 microns in size which are randomly oriented. The crystals may also possess a variety of crystalline structures including face-centred-cubic (fcc), hexagonally-close-packed (hcp), and random-close-packed (rcp). These and other imperfections within the crystal impair the optical characteristics of the crystal and make the crystal unsuitable for materials applications.

An improved method for growing colloidal photonic crystals has been proposed by P. N. Pusey and B. Ackerson, in patent GB 2 260 714. The improved method reduces the imperfections in the crystal by melting and aligning the crystal into a preferred structure. Specifically, this method relates to a suspension of monosized polymer colloidal spheres and consists of aligning the colloid into a face-centred-cubic crystal structure by applying a rectilinear shearing force usually by inducing flow in the liquid.

The photonic crystals formed by this method are essentially perfect face-centred-cubic structures. The method enables single crystals to be grown over areas larger than 1 $cm^2$.

At the end of the growth process, after sufficient shearing force has been applied to establish a substantially single crystal structure, the structure may be sealed to retain the carrier liquid. Alternatively, some form of gelling agent may be added to the carrier liquid to improve the stability of the structure or the carrier liquid may be allowed to evaporate to a leave a self-supporting structure of colloidal particles.

Shearing produces two types of single face-centred-cubic structure, one type being produced on the forward shear, the second type being produced on the reverse shear. When the shearing is stopped the colloid relaxes into a twinned face-centred-cubic structure. In the case of the twinned arrangement both forms of face-centred-cubic structure coexist within the crystal, one on top of the other.

Whilst the twinned face-centred-cubic structure exhibits useful optical characteristics, the single face-centred-cubic arrangement provides improved optical properties over the former. For example, the single face-centred-cubic structure demonstrates improved photonic band-gap properties and can be optimised to be reflective for a large range of angles of incident radiation and polarisation angles (for incident radiation within a limited wavelength range); see for example Yablonovitch et al, "Three-dimensional photonic band structure", [(Yablonovitch, E., Gmitter, T. J., Leung, K. M., Meade, R. D., Rappe, A. M., Brommer, K. D., Joannopoulos, J. D., "Three-dimensional photonic band structure", Opt. & Qu. Elect., 24, S273, 1992] and references therein. The single face-centred-cubic structure therefore offers a greater potential for high quality optical devices but cannot be made by the aforementioned linear shearing method because of the tendency of the crystal to relax into the twinned face-centred cubic structure.

Further limitations of current colloidal photonic crystals relate to the physical properties of the crystals. Current colloidal photonic crystals are relatively fragile and lack permanence, largely due to the fact that the crystalline layers are merely held in place between rigid parallel plates. With reference to configurations in which the carrier fluid is retained within the colloidal crystal, the sealing can become compromised allowing unwanted evaporation of carrier liquid leading to degradation of the crystalline structure. Further, the physical dimensions of the crystals remain relatively small precluding widespread adoption of colloidal photonic crystals in optical applications.

It is an object of the present invention to provide an improved method for producing robust large area colloidal photonic crystals.

According to the present invention, a method of growing an essentially perfect colloidal photonic crystal exhibiting a single face-centred-cubic structure comprises the steps of:

preparing a suspension of monosized colloidal spheres having a volume concentration that produces spontaneous local crystallisation in a suitable dispersion medium, inserting the colloidal suspension into a gap between two substantially parallel surfaces, subjecting the surfaces to relative oscillating motion parallel to their surfaces and, subjecting the surfaces to a series of small linear displacements relative to each other, the displacements being parallel to their surfaces and in two dimensions, comprising the sequence of applying a linear displacement to one of the surfaces with respect to the other surface, rotating the direction in which the linear displacement is applied to the surface by substantially 120 degrees in a single constant direction and applying a further linear displacement to the surface, the sequence being repeated until the colloidal photonic crystal has been purified into a single face-centred-cubic structure.

Preferably the dispersion medium is one that can be changed from a liquid phase to a solid phase in order to fix the colloidal crystalline structure.

The direction of rotation may be either clockwise or anticdockwise.

In an another arrangement, the method of growing an essentially perfect colloidal photonic crystal exhibiting a single face-centred-cubic structure comprises the steps of:

preparing a suspension of monosized colloidal spheres having a volume concentration that produces spontaneous local crystallisation, in a dispersion medium that can be changed from a liquid phase to a solid phase in order to fix the colloidal crystalline structure inserting the colloidal suspension into a gap between two substantially parallel surfaces, and subjecting the surfaces to relative oscillating motion parallel to their surfaces.

In particular, the magnitude of the small linear displacements applied to the surfaces is substantially equal to the product of the diameter of the colloidal spheres and the number of crystalline layers in the crystal.

In one preferred arrangement the surfaces are displaced with respect to each other in an equilateral triangle.

The minimum volume fraction of monosized colloidal spheres is advantageously 0.49 and preferably the radius of the monosized colloidal spheres is in the range 0.01 µm to 100 µm.

Preferably the radius of the monosized colloidal spheres is in the range 0.05 µm to 10 µm.

The colloidal spheres may comprise at least one of a polymer, a nonlinear material, a magnetic material, a metal, a semiconductor, glass doped with an active dye, polymer doped with an active dye, and silica. In particular the colloidal spheres may be polymethylmethacrylate.

The material used for the dispersion medium is preferably at least one of an adhesive, a polymer, a resin, a non-linear optical material, an active optical material, octanol.

In a preferred embodiment the active optical material used for the dispersion medium is a liquid crystal material.

In one arrangement the dispersion medium is subsequently removed from the colloidal photonic crystal to leave a structure comprising colloidal spheres surrounded by an interconnecting matrix of voids. A substitute material may be subsequently introduced into the interconnecting matrix of voids surrounding the colloidal spheres. The substitute material may be at least one of a metal, a semiconductor, a nonlinear optical material, an active optical material.

In a preferred embodiment the colloidal spheres may be subsequently removed from the substitute material to produce an inverse single face-centred-cubic structure.

In a further preferred embodiment the active optical material used for the substitute material is a liquid crystal material.

Where the dispersion medium or the substitute material is a liquid crystal, means for applying an electric field to the liquid crystal material may be added to the colloidal photonic crystal.

In a preferred embodiment, the dispersion medium is an epoxy resin and the method of growing an essentially perfect colloidal photonic crystal exhibiting a single face-centred-cubic structure further comprises the subsequent step of curing the resin to form a solid interconnecting matrix between the colloidal spheres.

The curing process preferably includes at least one of exposure to electromagnetic radiation, exposure to ultraviolet radiation, chemical reaction, elevation of temperature.

At least one of the substantially parallel surfaces may comprise a substantially flexible membrane.

In a preferred embodiment bulk colloidal photonic crystal film may be produced by applying the linear displacements to the parallel surfaces by rolling means.

In a further preferred embodiment the method further includes the intermediate step of applying a detachable membrane to the internal face of at least one of the parallel surfaces prior to Introducing the colloidal suspension.

The internal surface of at least one of the parallel surfaces may be textured to promote the growth of multiple crystal domains.

The refractive index of the dispersion medium may be substantially different from the refractive index of the colloidal spheres. Further, the refractive index ratio between the colloidal spheres and the dispersion medium may greater than two.

In one preferred arrangement, the method comprises the subsequent step of removing the colloidal spheres from the solidified dispersion medium to produce an inverse single face-centred-cubic structure.

In a further preferred arrangement the method further comprises the subsequent step of introducing a substitute material into the voids created in the solidified dispersion medium by the removal of the colloidal spheres, thereby producing a substituted single face-centred-cubic structure. The substitute material may be a non-linear optical material, an active optical material or a laser dye.

In a preferred arrangement the two surfaces used to retain the colloidal suspension may be concentrically cylindrical.

In a second aspect of the invention there is provided a colloidal crystal grown according to the above method.

In one preferred arrangement the colloidal crystal forms an optical notch filter wherein the colloidal sphere radius and refractive index of the dispersion medium are selected to co-operate to reflect at least one specific wavelength and to transmit other wavelengths.

In a further preferred arrangement the colloidal crystal is incorporated in an optical device which further comprises a liquid crystal material and means for applying an electric field to the liquid crystal material, wherein a variable voltage may be applied to the liquid crystal material to change the refractive index contrast between the liquid crystal material and the colloidal spheres.

Figure 2:
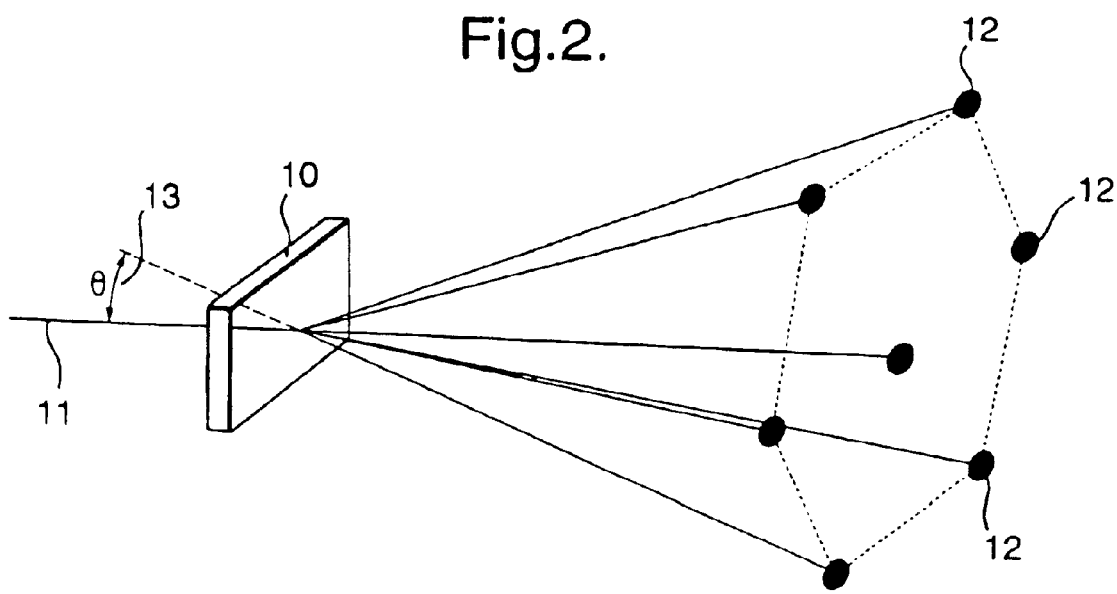
Figure 5A:
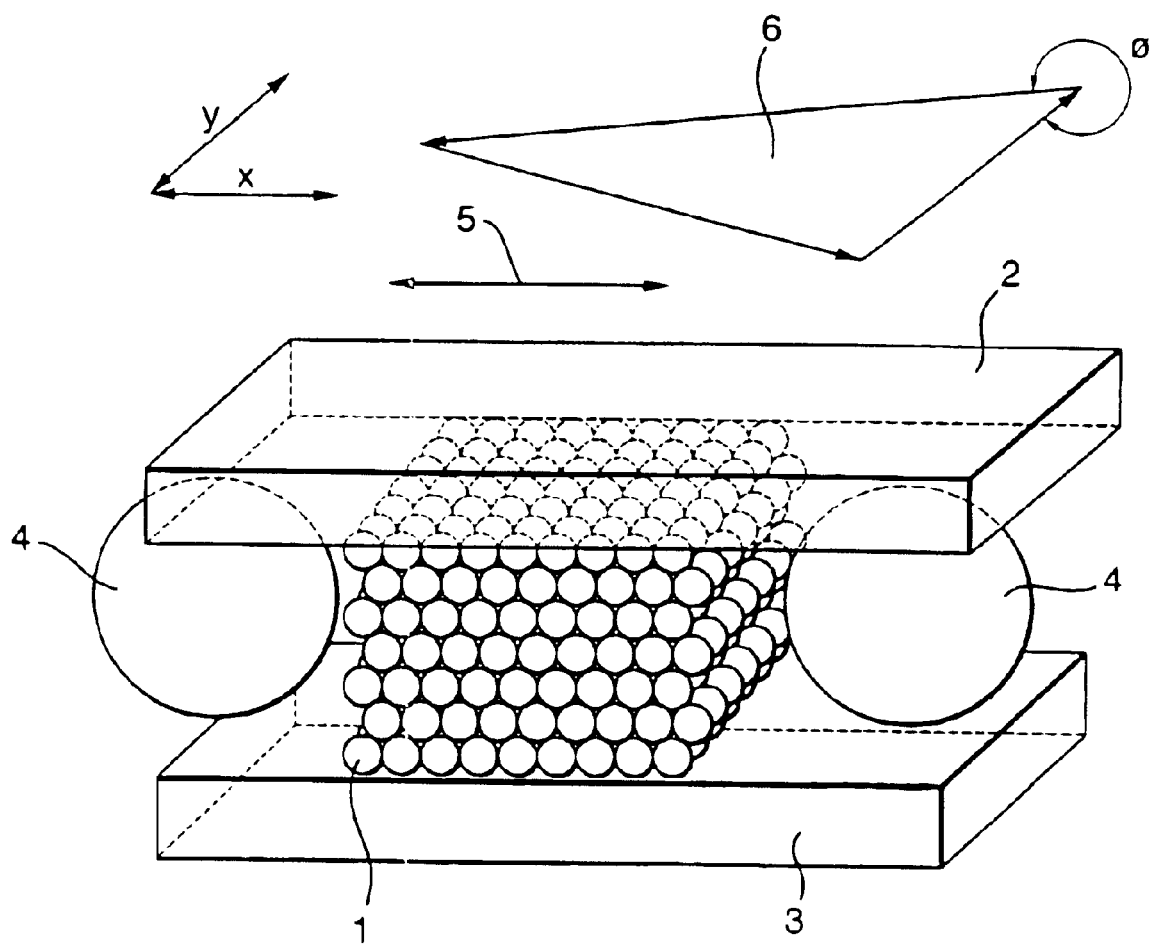
Figure 5B:
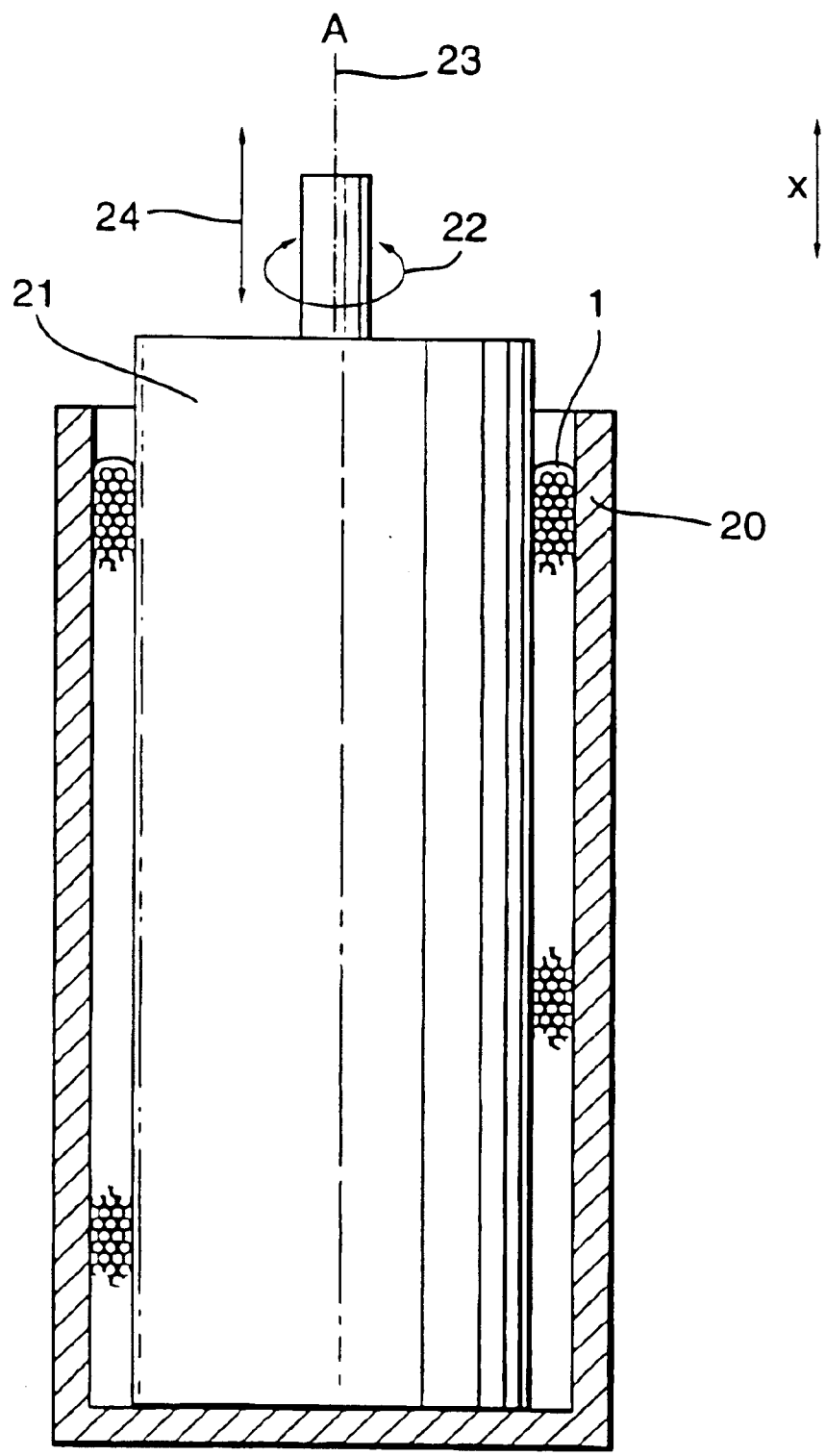
Figure 6A:
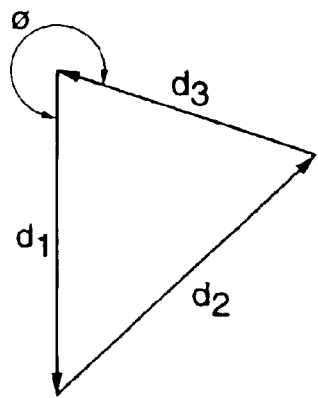
Figure 6B:
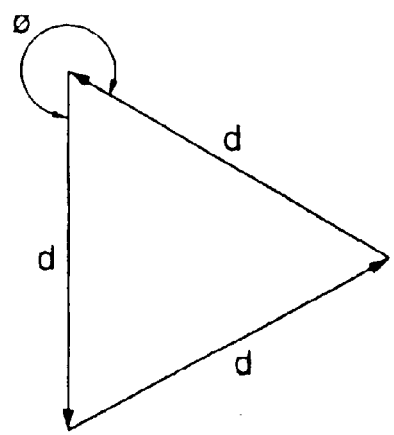
Figure 7:
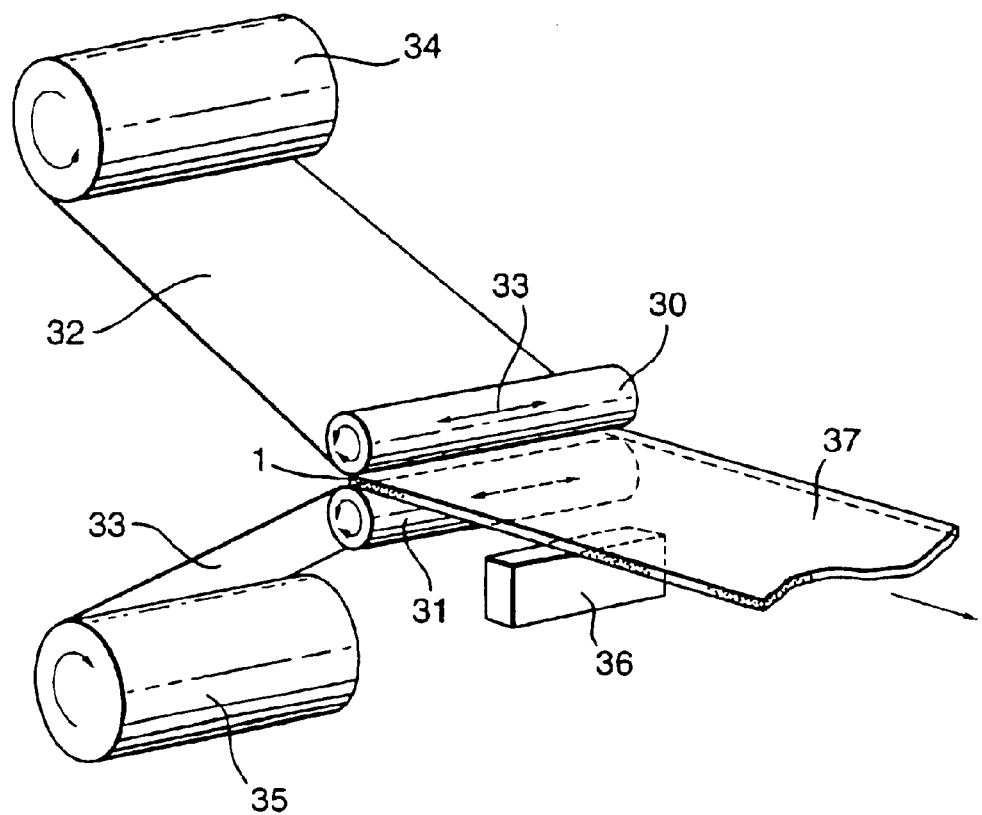

The invention will now be described, by example only, with reference to the accompanying drawings in which;

FIG. 1 illustrates the conventional method for growing colloidal photonic crystals by applying a linear shearing force to a suspension of monosized polymer colloidal spheres, FIG. 2 shows a diagram of the arrangement used to characterise the structure of the colloidal photonic crystal, FIG. 3 shows schematic representations of the three different diffraction patterns produced during the growth process. Specifically, FIGS. 3a and 3b illustrate the diffraction patterns produced by the two forms of single face-centred-cubic crystals respectively, whilst FIG. 3c shows the diffraction pattern formed at the start of the growth process by the twinned face-centred-cubic configuration, FIG. 4 shows graphs of intensity of diffracted radiation versus angle of incidence (θ) for the various crystalline structures produced during the growth process, FIG. 5a illustrates the improved method for producing colloidal photonic crystals by applying a composite two dimensional shear to the colloidal crystal, FIG. 5b illustrates the improved method for producing colloidal photonic crystals by applying a composite two dimensional shear to the colloidal crystal in a cylindrical geometry, FIG. 6a Illustrates the Iterative steps within the composite shearing process and the directions in which successive shears are applied to the crystal, FIG. 6b illustrates the specific case where the composite shear process is an equilateral triangle, FIG. 7 illustrates schematically a technique for large scale production of single face-centred-cubic colloidal photonic crystals using the composite two-dimensional shear method.

Referring to FIG. 1, the conventional method for growing colloidal crystals utilises a suspension of monosized polymer colloidal spheres (1) placed between two glass plates (2,3). Typically the colloid consists of 800 nm polymethylmethacrylate spheres suspended in octanol at a volume concentration that produces spontaneous crystallisation (in practice greater than 49% by volume). The two glass plates (2,3) are cleaned and 10 micron spacer beads (4) are spread onto one of the plates. The colloid suspension (1) is placed on one plate and the other plate placed on top and pressure is applied so that the space between the plates is completely filled. At this point the sample is polycrystalline comprising randomly oriented small crystals.

The sample is now sheared by applying an oscillating linear lateral displacement (5) to the top plate (2) with respect to the lower plate (3). The linear lateral oscillations are confined to a single direction, denoted in the figure as the x-direction, and have an amplitude approximately equal to ten times the gap between plates (2) and (3). This melts the crystal and aligns the colloids into hexagonally close packed layers.

The sample is then sheared by linear oscillations of a smaller amplitude to force the colloids into a face-centred cubic structure. The amplitude of the oscillations is typically equal to the product of the diameter of the colloidal spheres and the number of crystalline layers in the crystal. Importantly one face-centred cubic structure is produced on the forward shear stroke and another face-centred cubic structure is favoured on the backward stroke. If the shearing is stopped the colloid relaxes into a twinned face-centred cubic structure, both forms of face-centred cubic structure coexisting one on top of the other.

Referring to FIG. 2. the optical properties of the colloidal crystal depend on the crystal structure and this phenomenon can be used to characterise the structure of the colloidal crystal produced. The sample crystal (10) is illuminated with a laser beam (11) and the intensity of the diffracted spots (12) is measured as a function of the angle of the incident beam θ (13). During the shearing operation a different diffraction pattern is produced by each of the two types of single face-centred-cubic structure.

On the forward shear stroke the first single face centred-cubic structure produces a diffraction pattern comprising three Bragg spots spaced 120 degrees apart, as shown in FIG. 3a. On the reverse shear stroke the second single face-centred-cubic structure produces a different diffraction pattern of three different Bragg spots spaced at 120 degrees apart, as shown in FIG. 3b. Upon removing the linear shearing. force, the colloid relaxes into a twinned face-centred-cubic structure and all six Bragg spots are visible, as shown in FIG. 3c.

Referring to FIG. 4, the graphs of intensity of diffracted radiation versus angle of incidence (θ) illustrate the spatial distribution and intensity of the various crystalline structures produced during the shearing process. The intensity and spatial distribution of the diffracted beams are important parameters in determining the crystalline structure and have an impact on the performance any potential optical device incorporating the colloidal photonic crystal. FIG. 4a illustrates the response from the random close pack structure prior to applying any shearing force to the sample. FIG. 4b shows the response from the hexagonal close packed crystal. FIGS. 4c and 4d show graphs of intensity versus incident angle for the two single face-centred-cubic structures respectively.

The tendency of the colloidal crystal to relax into a twinned face-centred-cubic structure may be eliminated by using an enhanced shearing process as illustrated in FIGS. 5a and 5b.

Referring to FIG. 5a, the enhanced method of producing single face-centred-cubic crystals utilises a suspension of monosized polymer colloidal spheres (1) placed between two glass plates (2,3). The colloid consists of 800 nm polymethylmethacrylate spheres suspended in octanol at a volume concentration that produces spontaneous crystallisation (greater than 49% by volume). The two glass plates (2,3) are cleaned and 10 micron spacer beads (4) are spread onto one of the plates. The colloid suspension (1) is placed on one plate and the other plate placed on top and pressure is applied so that the space between the plates is completely filled. A polycrystalline sample is obtained comprising randomly oriented small crystals.

The sample is now sheared by applying an oscillating linear lateral displacement (5) to the top plate (2) with respect to the lower plate (3). The linear lateral oscillations are confined to a single direction, denoted in FIG. 5 as the x-direction. The linear lateral oscillations may typically be of an amplitude equal to ten times the gap between plates (2) and (3). This melts the crystal and aligns the colloids into hexagonally close packed layers.

The sample is then subjected to a composite shear (6) by applying a sequential set of shearing forces to the sample. The sequential set of shearing forces causes the top plate (2) to undergo a series of linear, two dimensional displacements with respect to the lower plate (3). The crystalline layers within the sample experience shearing forces with components in both x and y directions, forcing the colloid into a single face-centred-cubic structure and ensuring the single face-centred-cubic structure is maintained in preference to the twinned face-centred-cubic structure.

The composite shearing process is illustrated in FIG. 6a. Specifically, the composite process consists of rotating the direction in which the shear force is applied to the crystal by substantially +120 degrees (angle ø) between successive shears in the plane of the substrate. This produces the first form of the single face-centred-cubic crystalline structure.

Alternatively, the direction in which the shear force is applied to the crystal is rotated by substantially −120 degrees (angle ø) between successive shears in the plane of the substrate. The alternative form of the single face-centred-cubic crystalline structure is produced within the crystal.

The successive linear displacements do not have to be equal magnitude, although a threshold exists above which the crystal structure melts and the colloids realign into hexagonally close packed layers. The magnitude of each linear displacement is typically equal to the product of the diameter of the colloidal spheres and the number of crystalline layers in the crystal. The process is repeated until all the crystalline layers have been sheared into a single face-centred-cubic structure. The crystalline structure can be confirmed by illuminating the sample with a laser beam and measuring the intensity of the diffracted Bragg spots as a function of the angle of the incident beam (FIG. 2 refers).

Typically, the path described by the top plate (2) during the composite shear process is an equilateral triangle as shown in FIG. 6b.

Cylindrical geometries may also be used to implement the composite two-dimensional shear as shown in FIG. 5b. Referring to FIG. 5b, the suspension of monosized polymer colloidal spheres (1) is placed between cylindrical plate (20) and rod (21), which are concentric. The sample is now sheared by applying an oscillating rotary motion (22) to the rod (21) about axis A (23). This melts the crystal and aligns the colloids into hexagonally close packed layers.

The sample is then subjected to the composite, two-dimensional shearing force by translating the rod in an oscillatory manner (24) along the x-axis whilst continuing to apply the oscillating rotary motion (22) about axis A (23), such that the two motions combine to rotate the direction in which successive shears are applied to the crystal by substantially 120 degrees. The colloid is forced into either the first or second form of the single face-centred-cubic crystal depending upon the direction of rotation of the shear force between successive shears.

The single face-centred-cubic crystalline structure produced by the enhanced composite shearing technique, using either linear or cylindrical geometries, may be further processed to modify the properties of the structure.

At the end of the growth process the dispersion medium may be removed from the colloidal crystal structure to leave a self supporting structure of colloidal spheres surrounded by an interconnecting matrix of voids. For the purpose of this specification the term void shall not be limited to cavities or spaces containing a vacuum but shall include cavities or spaces containing any combination of any gases, including air. The interconnecting matrix of voids may be subsequently filled with other materials to modify the optical properties of the photonic colloidal crystal.

The materials used to fill the interconnecting matrix of voids typically include metals or semiconductors, for example silicon, germanium or gallium arsenide.

Alternatively the interconnecting matrix of voids produced by the removal of the dispersion medium from the photonic colloidal crystal may be filled with an active material such a liquid crystal material. A nematic liquid crystal material may typically be used. Using a liquid crystal material in place of the dispersion medium in the photonic colloidal crystal enables the refractive index contrast between the colloidal 10 spheres and the dispersion medium to be controlled, thereby providing control over the diffractive and bandgap properties of the photonic crystal.

The refractive index contrast in the photonic crystal may be modified by varying the temperature of the liquid crystal material or by applying a variable electric field across the liquid crystal material in the photonic crystal.

Under low intensity illumination the nematic liquid crystal and the colloidal spheres are index matched and the crystal is substantially transparent. If the glass plates containing the colloidal photonic crystal are anti-reflection coated, transmission through the device may exceed 90%. Increasing the temperature of the liquid crystal material causes the liquid crystal to re-orientate and the liquid crystal molecules change from a nematic phase to an isotropic phase. This results in an increase in the refractive index contrast between the liquid crystal material and the colloidal spheres. Thus the colloidal photonic crystal now operates as a diffraction grating and transmission through the device decreases. If the wavelength of radiation incident on the colloidal photonic crystal corresponds to the position of the band gap in the photonic crystal then the transmission through the device is greatly reduced.

The temperature of the liquid crystal material may be varied by heating directly the bulk colloidal photonic crystal. Alternatively local heating of the liquid crystal material may be brought about by illumination with a high intensity pulse. Absorption of the high intensity pulse by the colloidal photonic crystal (both by the colloidal spheres and the and the liquid crystal material) giving rise to local heating of the liquid crystal material.

Laser dyes may be also be incorporated to enhance this effect and to make the colloidal photonic crystal sensitive to specific wavelengths. In this case a laser dye is dissolved into the liquid crystal. An incident beam, of a wavelength which lies within the absorption band of the dye, absorbs energy from the beam giving rise to local heating as before, but now the transfer of energy from the incident beam to the crystal is significantly larger due to the increased absorption cross-section of the laser dye. The dye could also be incorporated into the colloidal spheres.

A non-linear dye may also be used, for example one that has a significantly different refractive index in its excited state compared to the ground state. This also induces a refractive index contrast under illumination.

The second method of modifying the refractive index contrast in the colloidal photonic crystal is to apply a variable electric field across the liquid crystal material in the colloidal photonic crystal. In this configuration the glass plates encapsulating the colloidal photonic crystal are coated with a layer of transparent conductor, for example indium tin oxide (ITO), thus allowing an electric field to be to be applied across the crystal. The orientation of the liquid crystal molecules can be varied simply by varying the voltage across the cell, thus changing the refractive index contrast and hence altering the diffractive and transmissive properties of the colloidal photonic crystal. The transmission or the intensity of any diffracted beams can be changed as a function of the applied electric field.

The colloidal photonic crystals incorporating a liquid crystal material may have applications in the protection of electr-optic devices from both high and low power laser pulses. The device may also be used as a limiter, a switch or a router by using a high intensity pump beam or the variable electric field applied to the liquid crystal to change the direction (redirect into a diffracted order) or block a low intensity probe beam which may be modulated to carry digital information.

An alternative method of incorporating the liquid crystal material into the colloidal photonic crystal would be to eliminate the intermediate dispersion medium (octanol) and utilise a liquid crystal dispersion medium during the initial growth process.

In this arrangement monosized colloidal spheres are suspended in a liquid crystal material at a volume concentration that produces spontaneous crystallisation. The configuration typically comprises 800 nm polymethylmethacrylate spheres suspended in K15 nematic liquid crystal at a volume concentration greater than 49% by volume. The colloidal suspension is placed between two glass plates and the sample is sheared using the enhanced composite shearing technique described previously, forcing the colloid into a single face-centred-cubic structure.

An alternative and complementary method of eliminating the tendency of the colloidal crystal to relax into a twinned face-centred-cubic structure is to modify the properties of the dispersion medium in which the colloidal spheres are suspended. The tendency of the crystal to relax into a twinned face-centred-cubic structure may be overcome by replacing the traditional octanol dispersion medium with a dispersion medium capable of undergoing a controllable phase change from a liquid phase to a solid phase. Accordingly, the phase of the dispersion medium can be changed from liquid to solid upon demand, enabling the crystal to be fixed into a single face-centred cubic structure at the appropriate stage in the crystal growth. Suitable dispersion mediums include adhesives, polymers, and resins. Epoxy-resin that can be cured by exposure to ultraviolet light is of specific interest as a suitable dispersion medium. Alternatively, epoxy-resins which are curable by chemical reaction, temperature or exposure to radiation may be used.

This technique can be used in conjunction with the conventional one-dimensional shear alignment process or with the composite two-dimensional shear alignment process shown in FIGS. 5a or 5b.

The use of a dispersion medium which is capable of undergoing a controlled phase change from a liquid phase to a solid phase provides an inexpensive means of producing large area, robust single face-centred-cubic crystals. Crystals produced by the method exhibit improved longevity and the crystal structure is essentially permanent Furthermore, the method lends itself to mass production applications.

The colloidal crystal is prepared by dispersing monosized polymer colloidal spheres in an epoxy resin that can be hardened by exposure to ultraviolet light. Typically the colloid consists of 800 nm polymethylmethacrylate spheres at a volume concentration that produces spontaneous crystallisation (greater than 49% by volume). The suspension is confined between two glass plates (2,3) and pressure is applied so that the space between the plates is completely filled. 10 micron spacer beads are used to control the separation of the glass. A controlled linear one-dimensional shear or a composite two-dimensional shear is applied to align the crystal into a single face-centred-cubic structure.

The viscosity of the epoxy resin increases the relaxation time of the crystal compared to the conventional octanol dispersion medium and it is possible to harden the resin whilst maintaining the single face-centred-cubic structure by exposing the sample to ultraviolet radiation. After exposure to the ultraviolet radiation, the epoxy resin forms a strong interconnecting matrix between the colloidal spheres making the crystal structure robust and essentially permanent.

Furthermore, the solid interconnecting matrix facilitates the fabrication of inverse face-centred-cubic structures which exhibit large full photonic band-gaps. For example, the polymer colloidal spheres may be removed by dissolving in a suitable solvent. A non-linear material or an active material such as a laser dye may be introduced to fill the gaps left by dissolving the colloidal spheres. This provides a route for producing photonic crystals in materials that cannot be made directly by conventional methods.

The use of a solid suspension medium also enables the mechanical properties of the supporting outer parallel plates to be modified since the colloidal crystal produced by this method may be made to be self-supporting. For example, the thickness of the parallel plates which are used to retain the colloid during the crystal growth phase may be reduced. In this case the mechanical properties of the solid dispersion medium contribute to the overall strength of the structure.

Alternatively, a detachable thin film or membrane could be applied to the internal surface of one or both of the parallel plates prior to the introduction of the colloid. After the crystal has been grown and the dispersion medium solidified, the parallel plates could be removed to reveal a robust laminated colloidal photonic crystal film. The film or membrane could be either rigid or flexible, allowing the laminated colloidal crystal colloid consists of 800 nm polymethylmethacrylate spheres at a volume concentration that produces spontaneous crystallisation (greater than 49% by volume). The suspension is confined between two glass plates (2,3) and pressure is applied so that the space between the plates is completely filled. 10 micron spacer beads are used to control the separation of the glass. A controlled linear one-dimensional shear or a composite two-dimensional shear is applied to align the crystal into a single face-centred-cubic structure.

The viscosity of the epoxy resin increases the relaxation time of the crystal compared to the conventional octanol dispersion medium and it is possible to harden the resin whilst maintaining the single face-centred-cubic structure by exposing the sample to ultraviolet radiation. After exposure to the ultraviolet radiation, the epoxy resin forms a strong interconnecting matrix between the colloidal spheres making the crystal structure robust and essentially permanent.

Furthermore, the solid interconnecting matrix facilitates the fabrication of inverse face-centred-cubic structures which exhibit large full photonic bandgaps. For example, the polymer colloidal spheres may be removed by dissolving in a suitable solvent. A non-linear material or an active material such as a laser dye may be introduced to fill the gaps left by dissolving the colloidal spheres. This provides a route for producing photonic crystals in materials that cannot be made directly by conventional methods.

The use of a solid suspension medium also enables the mechanical properties of the supporting outer parallel plates to be modified since the colloidal crystal produced by this method may be made to be self-supporting. For example, the thickness of the parallel plates which are used to retain the colloid during the crystal growth phase may be reduced. In this case the mechanical properties of the solid dispersion medium contribute to the overall strength of the structure.

Alternatively, a detachable thin film or membrane could be applied to the internal surface of one or both of the parallel plates prior to the introduction of the colloid. After the crystal has been grown and the dispersion medium solidified, the parallel plates could be removed to reveal a robust laminated colloidal photonic crystal film. The film or membrane could be either rigid or flexible, allowing the laminated colloidal crystal film to be applied to a second surface and enabling it to conform to the surface (subject to the solidified suspension medium exhibiting suitable mechanical properties). In a further configuration the parallel plates could be removed completely after the suspension medium had been solidified. This may be facilitated by applying a release agent directly to the internal surface of one or both of the parallel plates. However, this method would require the suspension medium to provide all the mechanical strength for the structure since the outer parallel plates would have been eliminated.

Mindful of the potential requirement to produce colloidal photonic crystals on a large scale, an example of a suitable industrial production process is shown schematically in FIG. 7. The composite two-dimensional shearing method is retained and is provided in FIG. 7 by shearing the colloid between rollers (30,31). In the example the colloid (1) is inserted between two flexible film membranes (32,33) and the composite shear applied between rollers (30,31) which are subjected to translations (33) with respect to each other. The translations (33) applied to the rollers (31,31) are substantially perpendicular to the direction in which the colloid is admitted to the rollers. The flexible film membranes may be provided on reels (34,35) to facilitate continuous production of colloidal photonic crystal film (37). The dispersion medium is solidified by any of the aforementioned means as the colloidal crystal emerges from the rollers. For example, where the dispersion medium is an ultraviolet curable epoxy-resin, an ultraviolet source (36) may be used.

In an alternative arrangement, separate shearing and rolling means may be provided to respectively apply the translation and to feed the colloid through the process. The shearing means may be configured as non-rotary components.

The examples in the foregoing discussion have concentrated on colloidal photonic crystals incorporating monosized polymer colloidal spheres. However, alternative materials may be used for the colloidal spheres including non-linear optical materials, magnetic materials, metals, semiconductors, doped glass (for example using an active dye dopant), doped polymer (for example using an active dye dopant) and silica.

Additionally, essentially permanent colloidal photonic crystals and inverse face-centred cubic structures may be fabricated using the composite two-dimensional shear process without the need to change the phase of the dispersion medium from a liquid phase to a solid phase.

For example, the use of monosized silica colloidal spheres enables the colloidal photonic crystal to be fixed into a single face-centred cubic structure at the appropriate stage in the crystal growth. The colloidal crystal is prepared by dispersing monosized silica colloidal spheres in a dispersion medium which can be removed after the growth of the colloidal photonic crystal. Typically the colloid consists of silica spheres suspended in octanol at a volume concentration that produces spontaneous crystallisation (greater than 49% by volume). The suspension is confined between two glass plates (2,3) and pressure is applied so that the space between the plates is completely filled. Spacer beads are used to control the separation of the glass. A composite two-dimensional shear is applied to align the crystal into a single face-centred-cubic structure.

At the end of the growth process the dispersion medium is removed from the colloidal crystal structure and the silica colloidal spheres sintered (heated) so that the spheres fuse together. After sintering the silica spheres form a self supporting structure of colloidal spheres surrounded by an interconnecting matrix of voids. The interconnecting matrix of voids may be subsequently filled with other materials to modify the optical properties of the photonic colloidal crystal. The material used to fill the voids may be any of a high index material, a metal, a semiconductor or an active material. The silica spheres may be subsequently removed, for example by etching, to form the inverse face-centred cubic structure which exhibits a wider photonic band gap than the conventional structure.

In the above process for producing essentially permanent colloidal photonic crystals and inverse face-centred cubic structures, the silica spheres may be replaced by alternative materials. For example polymer spheres may be fused together with similar effect. As before, the interconnecting matrix of voids may be filled with other materials and the polymer spheres may be subsequently removed to form the inverse face-centred cubic structure.

Further interesting optical effects may be achieved by encouraging the controlled growth of multiple large area colloidal crystal domains. Adjacent crystal domains may be tailored to exhibit different optical characteristics.

The composite two dimensional shear process is retained and the internal surface of one or both of the parallel plates is textured to promote the growth of multiple crystal domains. The textured surface may exhibit a specific pattern to control the growth of the crystal domains into a preferred configuration. The texture or pattern may be applied to the parallel plates by any suitable process including etching and embossing.

The methods described herein to produce single face-centred-cubic colloidal photonic crystals may be applied to the production of a variety of optical devices including optical filters and limiters. The reflective properties of the single face-centred-cubic colloidal photonic crystals also offer further opportunities for exploitation in optical devices.

What is claimed is:

1. A method of growing an essentially perfect colloidal photonic crystal exhibiting a single face-centred-cubic structure comprising the steps of:
   i. preparing a suspension of monosized colloidal spheres (1) having a volume concentration that produces spontaneous local crystallisation in a suitable dispersion medium,
   ii. inserting the colloidal suspension into a gap between two substantially parallel surfaces (2,3),
   iii. subjecting the surfaces to relative oscillating motion (5) parallel to their surfaces and,
   iv. subjecting the surfaces to a series of small linear displacements (6) relative to each other, the displacements being parallel to their surfaces and in two dimensions, comprising the sequence of applying a linear displacement to one of the surfaces with respect to the other surface, rotating the direction in which the linear displacement is applied to the surface by substantially 120 degrees in a single constant direction and applying a further linear displacement to the surface, the sequence being repeated until the colloidal photonic crystal has been purified into a single face-centred-cubic structure.

2. A method according to claim 1 wherein the dispersion medium is changeable from a liquid phase to a solid phase in order to fix the colloidal crystalline structure.

3. A method of growing an essentially perfect colloidal photonic crystal exhibiting a single face-centred-cubic structure comprising the steps of:
   i. preparing a suspension of monosized colloidal spheres (1) having a volume concentration that produces spontaneous local crystallisation, in a dispersion medium that is changeable from a liquid phase lo a solid phase in order to colloidal crystalline structure
   ii. inserting the colloidal suspension into a gap between two substantially parallel surfaces (2,3), and
   iii. subjecting the surfaces to relative oscilating motion parallel to their surfaces (5).

4. A method according to claim 1 wherein the magnitude of the small linear displacements applied to the surfaces is substantially equal to the product of the diameter of the colloidal spheres and the number of crystalline layers in the crystal.

5. A method according to claim 1 wherein the surfaces are displaced with respect to each other in an equilateral triangle.

6. A method according to claim 1 wherein the minimum volume fraction of monosized colloidal spheres is 0.49.

7. A method according to claim 1 wherein the radius of the monosized colloidal spheres is in th range 0.01 pm to 100 pm.

8. A method according claim 1 wherein the radius of the monosized colloidal spheres is in the range 0.05 pm to 10 pm.

9. A method according to claim 1 wherein the material used for the colloidal spheres is at least one of a polymer, a non-linear material, a magnetic material, a metal, a semiconductor, glass doped with an active dye, polymer doped with an active dye, silica.

10. A method according to claim 9 wherein the colloidal spheres are polymethylmethacrylate.

11. A method according to claim 1 wherein the material used for the dispersion medium is at least one of an adhesive, a polymer, a resin, a non-linear optical maternal, an active optical material, octanol.

12. A method according to claim 11 wherein the active optical material used for the dispersion medium is a liquid crystal material.

13. A method according to claim 1 wherein the dispersion medium is subsequently removed from the colloidal photonic crystal to leave a structure comprising colloidal spheres surrounded by an interconnecting matrix of voids.

14. A method according to claim 13 and further comprising the subsequent step of introducing a substitute material into the interconnecting matrix of voids surrounding the colloidal spheres.

15. A method according to claim 14 wherein the substitute material is at least one of a metal, a semiconductor, a non-linear optical material, an active optical material.

16. A method according to claim 15 wherein the substitute active optical material is a liquid crystal material.

17. A method according to claim 15 and further comprising the subsequent step of removing the colloidal spheres from the substitute material.

18. A method according to claim 12 and further comprising the step of adding to the colloidal photonic crystal means for applying an electric field to the liquid crystal material.

19. A method according to claim 2 wherein the material used for the dispersion medium is at least one of an adhesive, a polyner, a resin.

20. A method according to claim 1 wherein the dispersion medium is al epoxy resin and further comprising the subsequent step of curing the resin to form a solid interconnecting matrix between the colloidal spheres.

21. A method according to claim 20 wherein the curing process includes at least one of exposure to electromagnetic radiation, exposure to ultraviolet radiations chemical reaction, elevation of temperature.

22. A method according to claim 2 wherein at least one of the substantially parallel surfaces (2,3) comprises a substantially flexible membrane.

23. A method according to claim 2 wherein the series of small linear displacements (6) is applied to the surfaces by rolling means (30,31) to produce bulk colloidal photonic crystal film (37).

24. A method according to claim 2 and further comprising the intermediate step of applying a detachable membrane to the internal face of at least one of the parallel surfaces prior to introducing the colloidal suspension.

25. A method according to claim 1 wherein the internal surface of at least one of tie parallel surfaces is textured to promote the growth of multiple crystal domains.

26. A method according to claim 1 wherein the refractive index of the dispersion medium is substantially different from the refractive index of the colloidal spheres.

27. A method according to claim 26 wherein the refractive index ratio between the colloidal spheres and the dispersion medium is greater than two.

28. A method according to claim 2 and further comprising the subsequent step of removing the colloidal spheres from the solidified dispersion medium.

29. A method according to claim 28 and further comprising the subsequent step of introducing a substitute material into the voids in the solidified dispersion medium.

30. A method according to claim 29 wherein the substitute material is at least one of a non-linear optical material, en active optical material or a laser dye.

31. A method according to claim 1 wherein the two surfaces are concentrically cylindrical (20,21).

32. An essentially perfect, single face-centred-cubic colloidal photonic crystal produced by the method of claim 1.

33. An optical notch filter having a colloidal crystal according to claim 32 wherein the colloidal sphere radius and refractive index of the dispersion medium are selected to co-operate to reflect at least one specific wavelength and to transmit other wavelengths.

34. An optical device having a colloidal crystal according to claim 32 and further comprising:
   a liquid crystal material, and
   means for applying an electric field to the liquid crystal material
   wherein a variable voltage is applied to the liquid crystal material to change the refractive index contrast between the liquid crystal material and the colloidal spheres.

* * * * *